United States Patent [19]

Barre

[11] Patent Number: 4,532,440

[45] Date of Patent: Jul. 30, 1985

[54] FLIP-FLOP IN CURRENT MODE LOGIC CONTROLLED BY A TRANSFER CLOCK WITH AUXILIARY CURRENT APPLIED TO DIFFERENTIAL AMPLIFIER

[75] Inventor: Claude Barre, Munich, Fed. Rep. of Germany

[73] Assignee: Siemens Aktiengesellschaft, Berlin and Munich, Fed. Rep. of Germany

[21] Appl. No.: 438,750

[22] Filed: Nov. 3, 1982

[30] Foreign Application Priority Data

Dec. 1, 1981 [DE] Fed. Rep. of Germany ....... 3146547

[51] Int. Cl.³ .................. H03K 3/23; H03K 19/86; H03K 3/13; H03K 19/3
[52] U.S. Cl. .................. 307/455; 307/289; 307/272 A; 307/272 R; 307/467
[58] Field of Search ............... 307/455, 289, 272 R, 307/272 A, 290, 467, 482

[56] References Cited

U.S. PATENT DOCUMENTS

| | | | |
|---|---|---|---|
| 3,440,449 | 4/1969 | Priel et al. | 307/291 |
| 4,359,647 | 11/1982 | Trinkl | 307/238.1 |
| 4,408,134 | 10/1983 | Allen | 307/471 |

FOREIGN PATENT DOCUMENTS

| | | | |
|---|---|---|---|
| 282123 | 5/1979 | Fed. Rep. of Germany | 307/272 |
| 55-83333 | 6/1980 | Japan | 307/289 |

Primary Examiner—Stanley D. Miller
Assistant Examiner—Richard Roseen
Attorney, Agent, or Firm—Hill, Van Santen, Steadman & Simpson

[57] ABSTRACT

In order to avoid noise pulses which occur at the end of a clock pulse given a low signal level at the output of a clock-controlled flip-flop in ECL technology, an auxiliary current which is small in comparison to the primary current is supplied to a differential amplifier which is in a currentless condition during a clock pulse. As a result, the differential amplifier can be set to the respectively correct switch state before the end of the clock pulse.

3 Claims, 2 Drawing Figures

FLIP-FLOP IN CURRENT MODE LOGIC CONTROLLED BY A TRANSFER CLOCK WITH AUXILIARY CURRENT APPLIED TO DIFFERENTIAL AMPLIFIER

BACKGROUND OF THE INVENTION

1. Field of the Invention

The present invention relates to a flip-flop in current mode logic controlled by a transfer clock having a first differential amplifier with emitter-coupled transistors fed by a primary current source, and second and third differential amplifiers disposed in the collector circuits of the emitter-coupled transistors, whereby the transfer clock is applied to the base of the first transistor and the base of the second transistor is connected to a fixed potential.

2. Description of the Prior Art

Given flip-flop circuits constructed on the basis of current mode logic (ECL,CML), the circuit principle of series coupling or of series linkage is frequently employed (cf. "Der Fernmeldeingenieur", Vol. 27, No. 7, July 1973, pp. 19 and 20). For the purpose of a better understanding of the invention which shall be discussed below, a known, clock-controlled D flip-flop of this type which shall be referred to below is illustrated in FIG. 1 of the drawing.

A first differential amplifier having emitter-coupled transistors T1 and T2 is fed by a constant current source comprising a transistor T3 having a base connected to a first reference potential VR1 and an emitter resistor R1. A clock signal C level-shifted with the assistance of an emitter follower T0, R0 is applied to the base of the first transistor T1. The base of the second transistor T2 of the first differential amplifier is connected to a second reference potential VR2.

The emitters of the two transistors T4 and T5 of a second differential amplifier are connected to the collector of the transistor T1 of the first differential amplifier. The base of the transistor T4 forms a data input D for the information to be input into the flip-flop. The base of the third transistor T5 is connected to a third reference potential VR3.

A third differential amplifier having a pair of transistors T6 and T7 whose emitters are connected to the collector of the transistor T2 of the first differential amplifier. The transistor T6, whose base is likewise connected to the third reference potential VR3, has collector connected to the collector of the transistor T5 and to a load resistor R2 which it shares with the transistor T5 of the second differential amplifier. The voltage drop arising at the load resistor R2, in accordance with the respective switch state of the flip-flop and represents the stored information, finally determines the binary value of the output signal which is tapped at an output Q of the flip-flop which is additionally level-shifted by way of an emitter follower having a transistor T8 and an emitter resistor R3. The signal feedback required for the bistable behavior of the circuit arrangement occurs from the output Q to the base of the transistor T7 of the third differential amplifier.

A (positive) pulse at the clock input C renders the transistor T1 conductive. When a binary "1" is applied at the data input D at the same time, the current I1 supplies the constant current source flow through the transistor T4. The transistors T2 and T5 are turned off. Therefore, no current flows through the load resistor R2 and the output Q carries the binary value "1". At the end of the clock pulse at the input C, the transistor T1 transfers into its blocking condition and the transistor T2 becomes conductive. At the same time, the transistor T7 also becomes conductive, whereas the transistor T6 remains nonconductive. As a result, the signal level at the output Q likewise does not change. The information applied to the data input D is continuously stored. A change of the signal level at the data input D which may occur between two pulses of the transfer clock cannot take effect because the second differential amplifier with the transistors T4 and T5 is nonconductive because of the blockage of the transistor T1.

The input of a binary "0" to the data input D by a pulse fundamentally occurs in the same manner as that described for the input of the binary "1". Of course, the transistor T4 in the second differential amplifier is now first turned off and the transistor T5 is conductive. A voltage drop arises across the load resistor R2 and the output Q carries the lower signal level corresponding to a binary "0". Upon acceptance of the current I1 by the transistor T2 at the end of the clock pulse, therefore, the transistor T6 of the third differential amplifier becomes conductive so that the binary signal value "0" can continue to be tapped at the output Q of the flip-flop.

The transfer of a binary "0" to be stored from the second differential amplifier into the third differential amplifier, however, does not occur completely without interference. On the contrary, a short positive pulse (spike) arises at the output Q having a more or less large amplitude. The reason for this is that the current through the transistor T5 decreases faster than the rise of the current through the transistor T6. Therefore, the sum of the sub-currents does not remain constant.

A noise pulse at the output Q, however, cannot only lead to a false reaction of the following circuit arrangements but, rather, can also produce a misbehavior of the flip-flop, a loss of data.

SUMMARY OF THE INVENTION

It is therefore the object of the invention to entirely avoid such noise pulses or to at least limit such pulses to a harmless degree by way of corresponding circuit measures.

The foregoing object is achieved in a flip-flop of the type described in that an auxiliary current generated by an auxiliary current source is impressed on the third differential amplifier connected to the collector of the second transistor T2, the magnitude of the auxiliary current amounting to 5%–10% of the primary current supplied by the primary current source.

BRIEF DESCRIPTION OF THE DRAWINGS

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
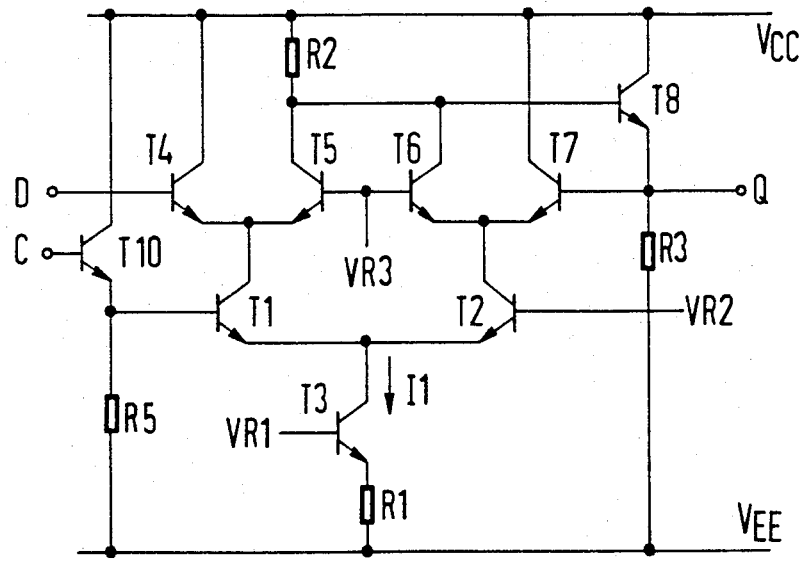
FIG. 1 is a schematic circuit diagram of the prior art flip-flop discussed above.

The circuit arrangement of FIG. 1 has been discussed above so that it is not necessary to discuss the same again.

Figure 2:
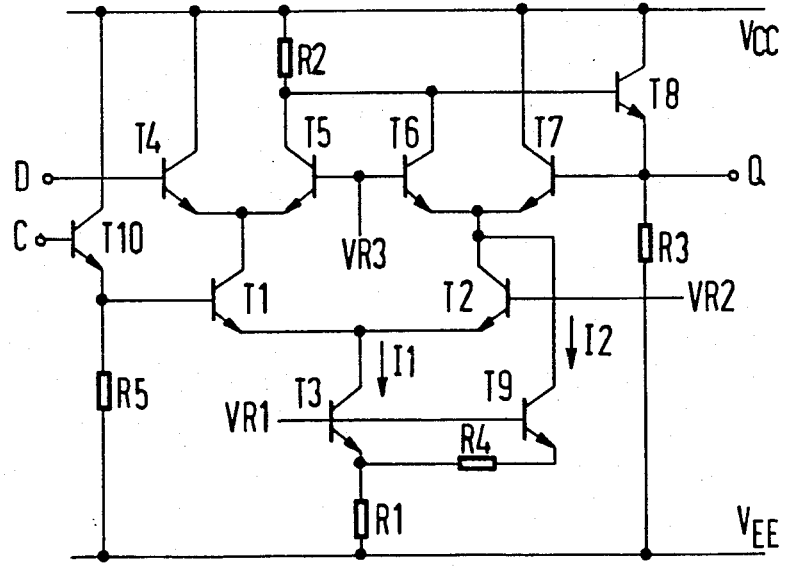
FIG. 2 is a schematic circuit diagram of a flip-flop constructed in accordance with the present invention and employing the same reference characters for like components with respect to the circuit arrangement of FIG. 1.

Referring to the embodiment of FIG. 2, an auxiliary current source is provided for supplying an auxiliary current I2, according to the present invention, as a current supply for the third differential amplifier having the transistors T6 and T7, even when the transistor T2 of the first differential amplifier is turned off during the interval of a clock pulse of the transfer clock. According to FIG. 2, the auxiliary current source connected to the emitters of the transistors T6 and T7 of the third differential amplifier comprises a transistor T9 and an emitter resistor R4. The base of the transistor T7 is connected to the reference potential VR1. By way of a corresponding dimensioning of the resistor R4, which can be connected to the emitter of the transistor T3 of the primary current source or to the operating voltage terminal $V_{EE}$, the current I2 supplied by the auxiliary current source is set in such a manner that it amounts to approximately 5%–10% of the current I1 from the primary current source T3, R1. In a manner known per se, the auxiliary current source can also be replaced by a resistor inserted between the emitters of the transistors T6 and T7 of the third differential amplifier and the operating voltage terminal $V_{EE}$.

What is achieved by feeding in the auxiliary current I2 is that the third differential amplifier is already placed in a clear and, in particular, in the proper switching state, during the interval of the clock pulse; expressed more precisely, as soon as the information applied at the data input D has advanced to the output Q. Therefore, which of the transistors T6 or T7 of the third differential amplifier is conductive or nonconducting, is already determined before the end of a clock pulse and, therefore, before the acceptance of the primary current I1 by the transistor T2 of the first differential amplifier. The continuity of the current flux through the load resistor R2 therefore only depends on the course of the current transfer in the first differential amplifier. In general, no significant fluctuations occur. The amplitude of noise pulses which may still occur is significantly less than half the signal boost and, therefore, innocuous.

In this context, the design of the auxiliary current source as seen in FIG. 2 in which the emitter resistor R4 of the transistor T9 is connectd to the emitter of the transistor T3 of the primary current source is to be particularly pointed out. When, during the transfer phase, in particular, the sum of the subcurrents flowing through the transistors T1 and T2 of the first differential amplifier and changing rapidly does not reach the normal value I1 of the primary current at every moment, then it is not only the voltage drop over the load resistor R2 which is reduce but, rather, the voltage drop over the resistor R1 of the primary current source is also temporarily reduced. Accordingly, the auxiliary current I2 rises and therefore supplies an increased amount to the voltage drop at the load resistor R2.

In summary, it should also be pointed out that the transistors T5 and T6 can be replaced by a transistor having two emitters. This replacement can be undertaken without a functional effect because both the base electrodes of the transistors T5 and T6, as well as their collectors, are respectively connected to one another.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a flip-flop for operation in the current mode logic technique and controlled by a transfer clock and of the type having a first differential amplifier with emitter-coupled transistors fed by a primary current source connected between an operating potential and the emitters of the emitter-coupled transistors, and second and third differential amplifiers each having emitter-coupled transistors whose emitters are connected to respective collector circuits of the emitter-coupled transistors of the first differential amplifier, and in which the transfer clock is applied to the base of a first emitter-coupled transistor of the first differential amplifier and in which the base of the second emitter-coupled transistor of the first differential amplifier is connected to a fixed reference potential, the improvement therein comprising:
an auxiliary current source for producing an auxiliary current, said auxiliary current source being connected between the emitters of the emitter-coupled transistors of the third differential amplifier and the operating potential and providing a current of 5%–10% of the primary current supplied by the primary current source.

2. The improved flip-flop of claim 1, wherein the primary current source and the auxiliary current source each comprise:
a transistor including a collector connected to the respective differential amplifier, a base connected in common with the like base of the transistor of the other current source, and an emitter; and
an emitter resistor connected between said emitter and the operating potential.

3. The improved flip-flop of claim 2, wherein said emitter resistor of said auxiliary current source is connected to said emitter of said transistor of said primary current source and by way of said emitter resistor of said primary current source to the operating potential.

* * * * *